(12) United States Patent
Pham (10) Patent No.: US 7,034,625 B2
(45) Date of Patent: Apr. 25, 2006

(54) METHOD AND APPARATUS TO IMPROVE FREQUENCY STABILITY OF AN INTEGRATED CIRCUIT OSCILLATOR

(75) Inventor: Glao Minh Pham, Milpitas, CA (US)

(73) Assignee: Power Integrations, Inc., San Jose, CA (US)

( * ) Notice: Subject to any disclaimer, the term of this patent is extended or adjusted under 35 U.S.C. 154(b) by 70 days.

(21) Appl. No.: 10/717,228

(22) Filed: Nov. 19, 2003

(65) Prior Publication Data

US 2005/0104672 A1    May 19, 2005

(51) Int. Cl.
     *H03L 7/00*     (2006.01)
(52) U.S. Cl. .................... 331/36 C; 331/34; 331/40
(58) Field of Classification Search .......... 331/36 C, 331/177 R, 177 V, 16, 34, 40
See application file for complete search history.

(56) References Cited

U.S. PATENT DOCUMENTS

| | | | |
|---|---|---|---|
| 4,009,398 A | 2/1977 | Yamada et al. | |
| 4,598,259 A | 7/1986 | Gontowski, Jr. | |
| 4,602,172 A | 7/1986 | Kikuchi | |
| 4,803,381 A | 2/1989 | Gornati et al. | |
| 5,045,800 A | 9/1991 | Kung | |
| 5,359,298 A * | 10/1994 | Abe | 331/2 |
| 5,387,882 A * | 2/1995 | Schoofs | 331/111 |
| 5,444,422 A * | 8/1995 | Mycynek | 331/116 R |
| 5,455,493 A | 10/1995 | Pulluru et al. | |
| 5,644,270 A * | 7/1997 | Moyer et al. | 331/34 |
| 5,870,000 A * | 2/1999 | Matsuda et al. | 331/34 |
| 6,194,935 B1 * | 2/2001 | Pioppo et al. | 327/170 |
| 6,339,349 B1 | 1/2002 | Rajagopalan | |
| 6,614,313 B1 * | 9/2003 | Crofts et al. | 331/1 R |

FOREIGN PATENT DOCUMENTS

| | | |
|---|---|---|
| EP | 04254534 | 2/2005 |
| JP | 2836762 | 2/2003 |

* cited by examiner

*Primary Examiner*—Timothy P. Callahan
*Assistant Examiner*—An T. Luu
(74) *Attorney, Agent, or Firm*—Blakely Sokoloff Taylor & Zafman LLP (57) ABSTRACT

A method and apparatus providing a simple low cost integrated circuit oscillator with improved frequency stability over a range of selected frequencies by reducing the impact of process and temperature variations on a base current of bipolar transistor of the integrated circuit oscillator. A voltage follower circuit included in an integrated circuit oscillator provided to is injected with a base current provided by a current mirror instead of a capacitor such that variations in the base current of the bipolar transistor over the range of operating temperature do not substantially alter the charge in the capacitor to change the frequency of the oscillator.

21 Claims, 5 Drawing Sheets

METHOD AND APPARATUS TO IMPROVE FREQUENCY STABILITY OF AN INTEGRATED CIRCUIT OSCILLATOR

BACKGROUND OF THE INVENTION

1. Field of the Invention

The present invention relates generally to integrated circuits, and more specifically, the present invention relates to integrated circuits that are controllers for switching power supplies.

2. Background Information

A large class of switching power supplies operates with a fixed switching frequency. It is often desirable to know that the switching frequency will not deviate by more than a specified amount from a nominal value during normal operation of the power supply. Such knowledge is very useful to designers because it allows them to select optimum components for the power supply and for the system that must operate with it.

Designers choose a switching frequency that is suitable for the particular application. The selection of frequency depends typically on the amount of power to be processed and the topology of the power converter. Various other parameters and specifications that are important to the use of the power supply also influence the selection of its switching frequency.

The controllers for modem switching power supplies are typically integrated circuits. Some integrated circuit controllers have only one fixed switching frequency, whereas others offer the designer a choice of two or more fixed switching frequencies. The controllers that have options for more than one fixed frequency typically allow the designer to select the desired frequency by way of a particular connection of terminals on the integrated circuit.

SUMMARY OF THE INVENTION

Disclosed are methods and apparatuses to reduce the difference between the actual frequency and the desired frequency of a simple low cost oscillator in an integrated circuit. In one embodiment, the oscillator generates a sawtooth voltage waveform by changing the voltage on a capacitor between two thresholds. The capacitor is part of the integrated circuit. Current sources add and remove electric charge on the capacitor to change its voltage between the thresholds. The frequency of the oscillator depends on the currents from the current sources that add and remove the electric charge on the capacitor. The current sources are designed with ordinary techniques for temperature compensation to reduce variations with temperature. The capacitor is coupled to the base of a first bipolar transistor, the emitter and the collector of the bipolar transistor coupled to other devices in the integrated circuit. A second bipolar transistor, substantially the same as the first bipolar transistor, is coupled to have the same base current as the first bipolar transistor. The base current of the second bipolar transistor is coupled to a current mirror circuit that adds current equivalent to the base current of the second bipolar transistor to the base current of the first bipolar transistor. Thus, the base current required by the first bipolar transistor comes from the current mirror and not from the capacitor. Hence, variations in the base current of the first transistor over the range of operating temperature do not substantially alter the charge of the capacitor to change the frequency of the oscillator.

Additional features and benefits of the present invention will become apparent from the detailed description, figures and claims set forth below.

BRIEF DESCRIPTION OF THE DRAWINGS

The present invention detailed illustrated by way of example and not limitation in the accompanying Figures.

DETAILED DESCRIPTION

An embodiment of a method to improve the stability of the nominal frequency of an integrated circuit oscillator over a wide range of nominal frequencies, temperature variations and process variations is disclosed. In the following description, numerous specific details are set forth in order to provide a thorough understanding of the present invention. It will be apparent, however, to one having ordinary skill in the art that the specific detail need not be employed to practice the present invention. Well-known methods related to the implementation have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

An objective in the design of integrated circuit controllers for switching power supplies is to achieve the desired performance at the lowest cost. Use of simple circuits that require the least possible semiconductor material is key to a low cost design. Therefore, it is desirable to generate all switching frequencies with one simple oscillator circuit. It is also desirable for the oscillator to minimize the deviation of each fixed frequency from a specified nominal value over the range of operating temperature and variations in the manufacturing process.

In general, the oscillator is coupled to other circuits in the integrated circuit. Special techniques are required to prevent the variations of parameters of circuits coupled to the oscillator from altering the frequency of the oscillator without sacrificing desired performance at the lowest possible cost. Variations of parameters can occur from changes in temperature and from tolerances of the manufacturing process.

Embodiments of the present invention involve methods and apparatuses to reduce the variation in frequency of the oscillator from changes in temperature and process variations over a range of selected nominal frequencies without substantial increase in complexity or sacrifice to performance.

Figure 1A:
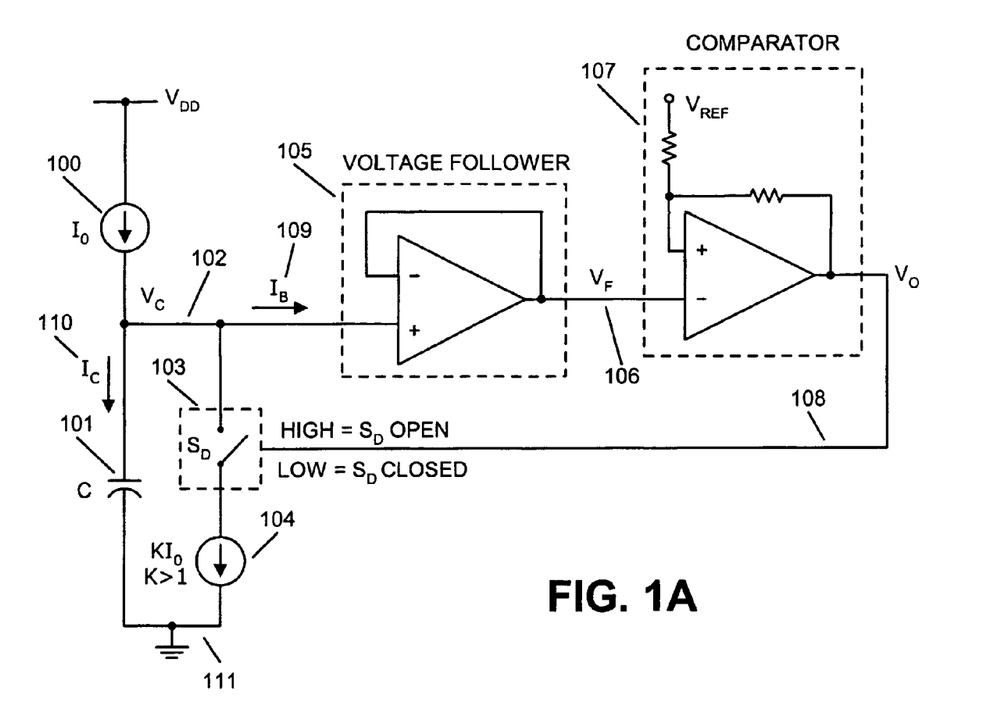
FIG. 1A is diagram that shows the general functional elements of a simple oscillator that is suitable for the controller of a switching power supply.

FIG. 1A shows a typical arrangement of a simple integrated circuit oscillator that is commonly used in control circuits for switching power supplies. As illustrated, a single pole single throw switch 103 is controlled by a comparator 107. It will be appreciated by one skilled in the art that switch 103 in FIG. 1A represents the function of an equivalent mechanical switch that is implemented with appropriate semiconductor devices such as for example a transistor in the integrated circuit. In one embodiment, comparator 107 is implemented with an input having hysteresis to give an upper threshold voltage and a lower threshold voltage. The design and operation of a comparator with hysteresis will be familiar to one skilled in the art.

Figure 1B:
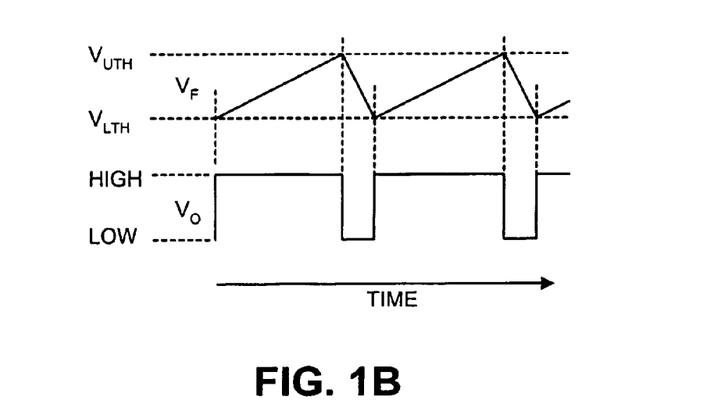
FIG. 1B is diagram that shows the waveforms associated with the elements of the simple oscillator illustrated in FIG. 1A.

As shown in the illustrated embodiment, comparator 107 has an input voltage $V_F$ on line 106 and an output voltage $V_O$ on line 108. All voltages are with respect to the ground reference 111. The comparator 107 changes the state of its output voltage $V_O$ from a high state to a low state when the voltage at its input 106 rises above an upper threshold $V_{UTH}$. The comparator changes the state of its output voltage $V_O$ from a low state to a high state when the voltage at its input 106 falls below a lower threshold $V_{LTH}$. To illustrate, one embodiment of the output voltage $V_O$ and the voltage $V_F$ is illustrated in FIG. 1B oscillating between $V_{UTH}$ and $V_{LTH}$. As illustrated in FIG. 1B, the voltage $V_F$ waveform is a sawtooth waveform oscillating between $V_{LTH}$ and $V_{UTH}$ and $V_O$ is a waveform oscillating between LOW and HIGH in one embodiment. The output $V_O$ of the comparator 107 is coupled to the single pole single throw switch 103 by line 108. The switch 103 is in its open state when the voltage on line 108 is at its high state. The switch 103 is in its closed state when the voltage on line 108 is at its low state. The input to the comparator 107 on the line 106 is the voltage $V_F$ that is also the output of voltage follower 105.

In the embodiment illustrated in FIG. 1, the purpose of the voltage follower 105 is to keep the voltage $V_F$ at its output on line 106 substantially equal to the voltage $V_C$ at its input on line 102, while conducting negligible current 109 from the capacitor 101. The state of the switch 103 causes the voltage on capacitor 101 to change in one of two ways. In one embodiment, the current $I_O$ from current source 100 is constant. It will be apparent to one skilled in the art that the current from current source 100 can be variable to change the characteristics of the oscillator for particular applications. In one embodiment, a cycle of the oscillator starts when switch 103 opens. When switch 103 is open, the current $I_C$ 110 into the capacitor is the difference between the constant current $I_O$ from current source 100 and the current $I_B$ 109. Since the current $I_B$ 109 is by design nearly constant and substantially less than the current $I_O$ from the current source 100, the voltages $V_C$ at line 102 and $V_F$ at line 106 will increase at a linear rate.

When the voltage $V_F$ at line 106 reaches the upper threshold $V_{UTH}$ of the comparator, the switch 103 will close. When switch 103 is closed, current $I_C$ 110 into the capacitor 101 will become negative because the current $KI_O$ from current source 104 is greater than the current $I_O$ from current source 100. The current $KI_O$ from current source 104 is greater than the current from current source 100 by the ratio K. In one embodiment, the ratio K is constant. It will be apparent to one skilled in the art that in other embodiments the ratio K may be variable to change the characteristics of the oscillator to suit particular applications.

Voltages $V_C$ at line 102 and $V_F$ at line 106 will decrease at a linear rate until the voltage $V_F$ at line 106 reaches the lower threshold of comparator 107, causing switch 103 to open. The cycle then repeats when switch 103 opens. The frequency of the oscillator is the rate at which the cycle repeats. Larger values of the current $I_O$ will produce higher frequencies. The duty ratio of the oscillator is the fraction of one cycle that corresponds to the time switch 103 is open. For a given value of K, the oscillator will have the same duty ratio for all values of the current $I_O$.

Figure 2:
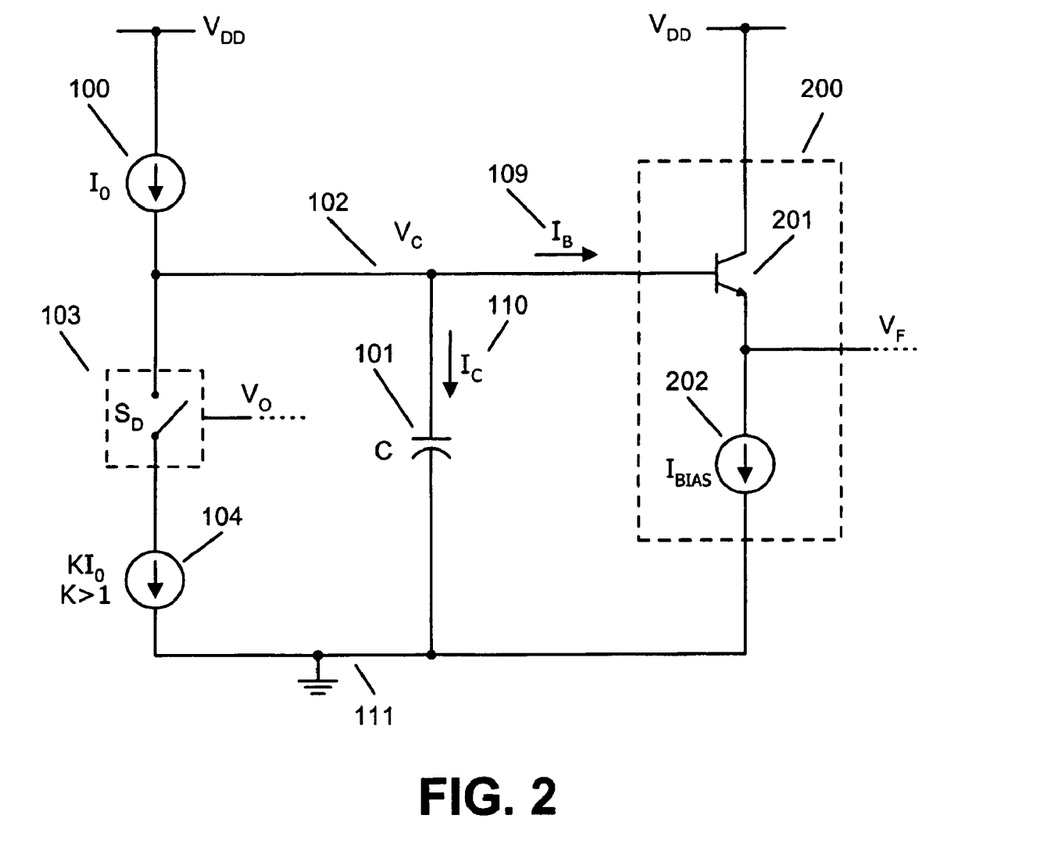
FIG. 2 is a diagram that shows a section of the oscillator of FIG. 1A showing a how a bipolar transistor is used for the voltage follower function.

In one embodiment, the voltage follower 105 includes a single NPN bipolar transistor with a current source in the emitter. FIG. 2 illustrates one embodiment of a typical single transistor implementation of voltage follower 105. As shown in FIG. 2, the voltage follower 200 in FIG. 2 includes bipolar NPN transistor 201 and emitter bias current source 202. A single transistor implementation of the voltage follower may use either a bipolar transistor or a field effect transistor.

An advantage of using a bipolar transistor in this embodiment instead of using a field effect transistor is that a field effect transistor is generally too slow to give the desired performance. A disadvantage of using the bipolar transistor for the voltage follower is that the current $I_B$ 109 into the base of transistor 209 usually cannot be made small enough to be negligible. The undesirable effect of current $I_B$ 109 is that it changes the frequency of the oscillator from the desired nominal value. The current $I_B$ 109 also changes its value significantly with temperature because it is the base current of a bipolar transistor, as will be familiar to one skilled in the art. The impacts of these undesirable effects are greater for lower frequencies of the oscillator because the current $I_B$ 109 becomes a larger fraction of the capacitor current $I_C$ 110 when the currents $I_O$ and $KI_O$ of current sources 100 and 103, respectively, are reduced to lower the frequency of the oscillator. It can be shown that the contribution of the current $I_B$ 109 to the fractional change in frequency with respect to the desired nominal value in the embodiment of FIG. 2 is $$\frac{\Delta f}{f_0} = -\left[\left(\frac{I_B}{I_0}\right)\frac{K-2}{K-1} + \left(\frac{I_B}{I_0}\right)^2 \frac{1}{K-1}\right] \quad \text{(Equation 1)}$$

where $f_0$ is the desired nominal frequency, $I_B$ is the current 109, $I_0$ is the value of the current source 100, and K is the ratio of current source 104 with respect to current source 100, K>1.

In one embodiment, $I_B$ is about 0.2 microamperes at room temperature, $I_0$ is 2.4 microamperes and K is 5. For these values, the presence of current $I_B$ 109 will reduce the actual frequency from the desired nominal frequency by about 6.4% at room temperature. For larger values of K with the same $I_B$ and $I_0$, the reduction in frequency approaches 8.3%. The impact of this effect will be greater at lower frequencies that use lower values of $I_0$. This change will be in addition to the change caused by variations in other parameters due to changes in temperature and variations in the manufacturing process. The variation in base current of a bipolar transistor can be large over the range of operating temperature, even if the emitter current is constant. It is desirable, therefore, to reduce or eliminate the influence of current $I_B$ 109 on the frequency of the oscillator. This is accomplished by one embodiment of the present invention, as illustrated for example in FIG. 3.

Figure 3:
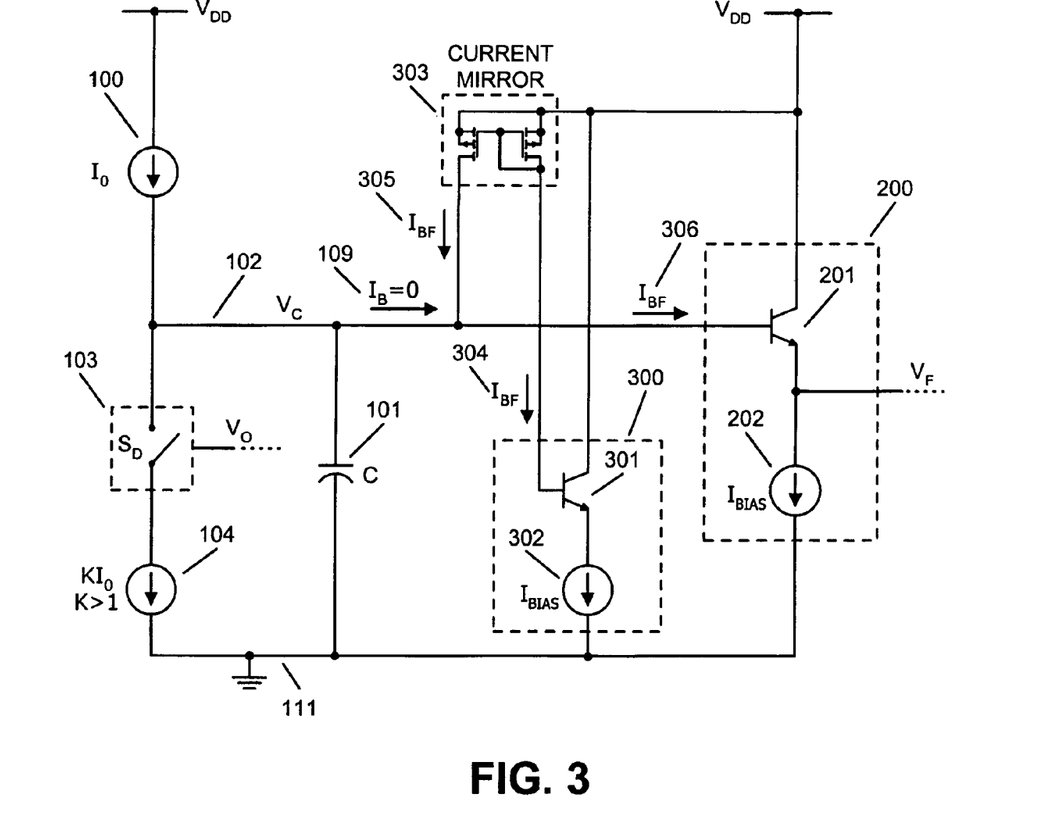
FIG. 3 is a diagram showing one embodiment of a section of an oscillator in accordance with the teachings of the present invention.

In one embodiment of a section of an oscillator circuit that is illustrated in FIG. 3, a first voltage follower circuit 200 includes a first NPN bipolar transistor 201 and a first emitter bias current source 202. A second voltage follower circuit 300 includes a second NPN bipolar transistor 301 and a second emitter bias current source 302. In one embodiment, the second voltage follower circuit 300 is substantially the same as the first voltage follower circuit 200. Therefore, the base current $I_{BF}$ 304 of the second voltage follower 300 in one embodiment is substantially the same as the base current $I_{BF}$ 306 of the first voltage follower 200. The base current $I_{BF}$ 304 is coupled to a current mirror 303. One skilled in the art will be familiar with various implementations of a current mirror, which is fundamental to the design of integrated circuits. It will also be appreciated by one skilled in the art that the second bipolar transistor 301 needs to match the first bipolar transistor 201 only in current density, and not in absolute current magnitude. The current mirror 303 and the second bipolar transistor 301 with its emitter bias current source 302 are designed such that the output current $I_{BF}$ 305 of the current mirror 303 matches the base current $I_{BF}$ 306 of the first bipolar transistor 201.

The output of the current mirror 303 injects into line 102 an output current $I_{BF}$ 305, which is substantially the same as current $I_{BF}$ 304, which is also substantially the same as the base current $I_{BF}$ 306 of the first voltage follower 200. Since the net input current $I_B$ 109 is the difference between the substantially equal currents 305 and 306, the current $I_B$ 109 is substantially zero. The reduction of current $I_B$ 109 to zero effectively eliminates its undesirable influence on the performance of the oscillator, and permits the use of the low cost bipolar transistor solution for the voltage follower function in accordance with the teachings of the present invention.

One skilled in the art will recognize that the magnitude of the current of current source 100 and current of current source 104 can be adjusted independently to change the frequency of the oscillator. One skilled in the art will also recognize that the ratio of the current of current source 100 to the current of current source 104 can be adjusted to change the frequency and the duty ratio of the oscillator. In one embodiment, different frequencies and duty ratios are selected by the addition and removal of current sources as shown by example in FIG. 4.

Figure 4:
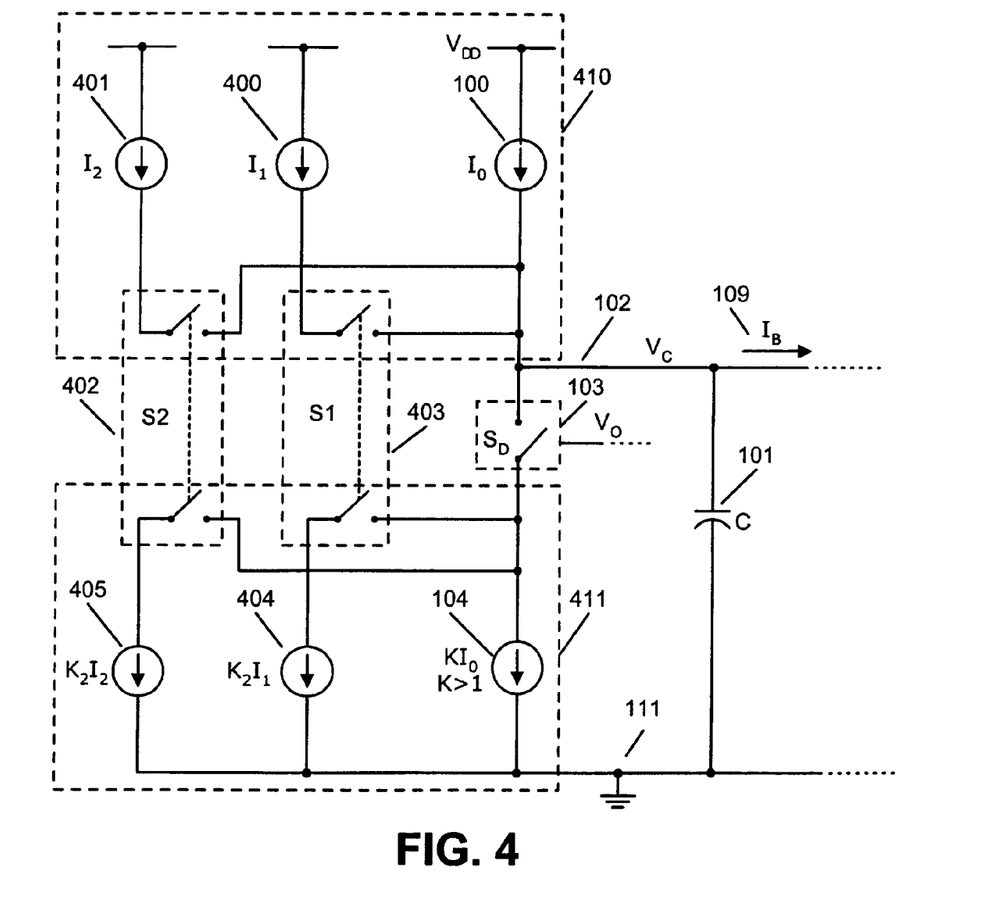
FIG. 4 is a diagram showing one embodiment of how a plurality of current sources can be switched to select different frequencies and duty ratios for an oscillator in accordance with the teachings of the present invention.

To illustrate, FIG. 4 is a diagram showing one embodiment of how a plurality of current sources can be switched to select different frequencies and duty ratios for an oscillator in accordance with the teachings of the present invention. As shown in the depicted embodiment, closure of double pole single throw switches 402 and 403 in FIG. 4 augments the current from current sources 100 and 104, which will vary that rate at which capacitor 101 is alternatingly charged and discharged, thereby varying the frequency and/or duty ratio of the oscillator. The oscillator operates at its lowest frequency when switches 402 and 403 are both open. Four distinct frequencies and duty ratios of the oscillator are possible with the example shown in FIG. 4. One skilled in the art will appreciate that additional current sources and switches may be used to achieve a greater number of frequency and duty ratio options. It will also be apparent to one skilled in the art that the addition of multiple current sources to a single current source is functionally equivalent to a change in the magnitude of a single current source. Therefore, in one embodiment, current source 410 may be considered a single variable current source comprised of current sources 100, 400 and 401 and switches S1 and S2 while current source 411 may be considered a single variable current source comprised of current sources 104, 404 and 405 and switches S1 and S2.

Figure 5:
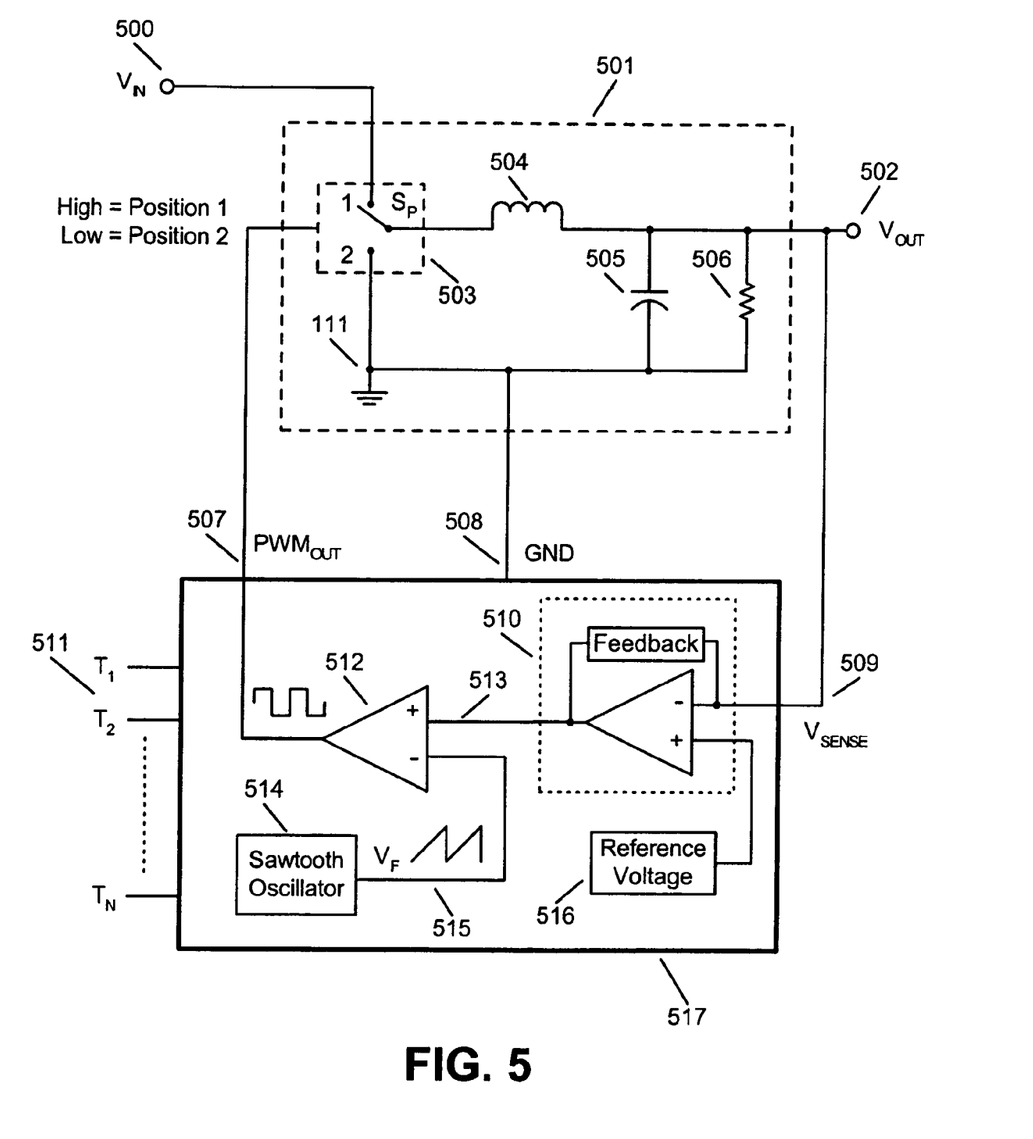
FIG. 5 is a diagram showing one embodiment of a switching power supply with an integrated circuit controller including one embodiment of an oscillator in accordance with the teachings of the present invention.

In yet another embodiment, an oscillator may be included in an integrated circuit that controls a switching power supply in accordance with the teachings of the present invention. To illustrate, FIG. 5 is a diagram of one embodiment of a switching power supply with an integrated circuit controller including one embodiment of an oscillator in accordance with the teachings of the present invention. An unregulated direct current (DC) input voltage $V_{IN}$ 500 is converted to a regulated DC output voltage $V_{OUT}$ 502 by a switching converter 501 that is controlled by an integrated circuit 517. All voltages are with respect to the ground reference 111. The state of a single pole double throw power switch $S_P$ 503 is controlled by the signal $PWM_{OUT}$ 507 from the integrated circuit 517.

In operation, switch $S_P$ 503 couples the inductor 504 to the input voltage $V_{IN}$ 500 when $PWM_{OUT}$ on line 507 is high. Switch $S_P$ 503 couples one end of the inductor 504 to the ground reference 111 when the signal $PWM_{OUT}$ on line 507 is low. A capacitor 505 is coupled to inductor 504 and filters the alternating current (AC) current in inductor 504 to provide a substantially DC voltage to a load 506. In one embodiment, a sawtooth oscillator 514 included in the integrated circuit 517 is designed in accordance with the teachings of the present invention. The frequency of the sawtooth oscillator 514 within integrated circuit controller 517 determines the rate of switching.

In one embodiment, a plurality of functional terminals 511 on the integrated circuit 517 can be coupled to operate the various functions of integrated circuit 517 in a desired manner. In one embodiment, functional terminals 511 can set the frequency of the oscillator 514. Integrated circuit 517 senses the output voltage $V_{OUT}$ 502 of the switching converter 501 at a terminal $V_{SENSE}$ 509 with respect to a ground terminal GND 508. In one embodiment, an error amplifier 510 within the integrated circuit 517 amplifies the difference between the voltage at terminal $V_{SENSE}$ 509 and a reference voltage 516 internal to the integrated circuit 517. A comparator 512 compares the error voltage output 513 of error amplifier 510 to the sawtooth voltage $V_F$ 515 that is an output of the oscillator 514. The output 507 of the comparator 512 is high when the error voltage 513 is greater than sawtooth voltage 515. The output 507 of comparator 512 is low when the error voltage 513 is less than the sawtooth voltage 515. Thus, the periodic switching of power switch $S_P$ 503 is modulated by the integrated circuit 517 in a manner to regulate the output voltage $V_{OUT}$ 502.

It will be apparent to one skilled in the art having the benefit of this disclosure that many ways are known to implement the function of the switch $S_P$ 503 with semiconductor devices, such as for example two transistors, or a transistor and a diode. In addition, one skilled in the art having the benefit of this disclosure will also appreciate that switching converter 501 in FIG. 5 is just one example of many different circuits that are commonly used in switching power supplies that can employ an oscillator in accordance with the teachings of the present invention.

In the foregoing detailed description, the method and apparatus of the present invention have been described with reference to a specific exemplary embodiment thereof. It will, however, be evident that various modifications and changes may be made thereto without departing from the broader spirit and scope of the present invention. The present specification and figures are accordingly to be regarded as illustrative rather than restrictive.

What is claimed is:

1. A circuit, comprising:
   a capacitor coupled to be alternatingly charged and discharged by first and second current sources;
   a first voltage follower circuit including a first bipolar transistor having a base coupled to the capacitor, the first bipolar transistor biased such that a voltage at an emitter of the first bipolar transistor follows a voltage on the capacitor; and
   a current mirror having first and second current paths, the first current path coupled to the base of the first bipolar transistor, the first current path providing substantially all of a base current received by the base of the first bipolar transistor such that the base current received by the base of the first bipolar transistor includes substantially zero current received from the capacitor.

2. The circuit of claim 1 wherein magnitudes of currents provided by the first and second current sources are variable to adjust a frequency of an oscillating voltage provided on the capacitor.

3. The circuit of claim 1 further comprising a second voltage follower circuit including a second bipolar transistor having a base coupled to the second current path, the second current path providing substantially all of a base current received by the base of the second bipolar transistor.

4. The circuit of claim 3 wherein the first and second bipolar transistors are substantially matched in current density.

5. The circuit of claim 3 further comprising first and second bias current sources, the first bias current source coupled to the emitter of the first bipolar transistor and the second bias current source coupled to an emitter of the second bipolar transistor.

6. The circuit of claim 1 further comprising a switch coupled between the second current source and the capacitor, the switched coupled to be alternatingly opened and closed such that when the switch is opened, the first current source is coupled to charge the capacitor and when the switch is closed, the first and second current sources are coupled to discharge the capacitor.

7. The circuit of claim 6 wherein the switch is coupled to be opened until the voltage on the capacitor is charged to a first threshold and wherein the switch is coupled to be closed until the voltage on the capacitor is discharged to a second threshold.

8. The circuit of claim 7 further comprising a comparator coupled to receive the voltage at the emitter of the first bipolar transistor, an output of the comparator coupled to control the switch.

9. The circuit of claim 1 wherein a ratio of currents provided by the first and second current sources is substantially fixed to provide a substantially fixed duty ratio of an oscillating voltage provided on the capacitor.

10. The circuit of claim 1 wherein a ratio of currents provided by the first and second current sources is variable to adjust a duty ratio of an oscillating voltage provided on the capacitor.

11. The circuit of claim 1 wherein magnitudes of currents provided by the first and second current sources are substantially fixed to provide a substantially fixed frequency of an oscillating voltage provided on the capacitor.

12. An integrated circuit, comprising:
   a capacitor coupled to a first current source and to a switch, the switch coupled to a second current source, a magnitude and a direction of the first current source and the second current source causing a voltage on the capacitor to change in one direction when the switch is open and to change in an opposite direction when the switch is closed;
   a voltage follower circuit including an input coupled to the capacitor;
   a comparator circuit having an input coupled to an output of the voltage follower circuit, an output of the comparator circuit coupled to the switch such that the switch is opened when the voltage on the capacitor reaches a first threshold and the switch is closed when the voltage on the capacitor reaches a second threshold;
   a first bipolar transistor included in the voltage follower circuit, the first bipolar transistor having an emitter coupled to a third current source, a base of the first bipolar transistor coupled to the capacitor;
   a second bipolar transistor substantially the same as the first bipolar transistor, an emitter of the second bipolar transistor coupled to a fourth current source, the fourth current source substantially the same as the third current source; and
   a current mirror circuit coupled to a base of the second bipolar transistor such that an output current of the current mirror circuit is substantially equal to a base current of the second bipolar transistor, the output current of the current mirror circuit coupled to the base of the first bipolar transistor.

13. The integrated circuit of claim 12 wherein the integrated circuit is included in a controller in a switching power supply.

14. The integrated circuit of claim 12 wherein the magnitude of the first current source and the magnitude of the second current source are substantially constant while the voltage on the capacitor is changing.

15. The integrated circuit of claim 12 wherein the magnitude of the first current source and the magnitude of the second current source are proportional with a ratio that is substantially constant while the voltage on the capacitor is changing.

16. The integrated circuit of claim 12 wherein the magnitude of the first current source and the magnitude of the second current source are variable.

17. An integrated circuit oscillator comprising
   a capacitor coupled to a first current source and a second current source, magnitudes and directions of the first current source and the second current source, respectively, causing a voltage on the capacitor to change in one direction until the voltage on the capacitor reaches a first threshold and to change in the opposite direction when the voltage on the capacitor reaches a second threshold;
   a first bipolar transistor having a base coupled to the capacitor;
   a second bipolar transistor having a current density substantially equal to a current density of the first bipolar transistor;
   a current mirror circuit coupled to a base of the second bipolar transistor, the current mirror circuit having an output substantially proportional to a base current of the second bipolar transistor, wherein the output of the current mirror circuit is substantially equal to a base current of the first bipolar transistor, wherein the output of the current mirror circuit is coupled to the base of the first bipolar transistor.

18. The integrated circuit of claim 17 wherein the integrated circuit is included in a controller in a switching power supply.

19. The integrated circuit of claim 17 wherein the magnitude of the first current source and the magnitude of the second current source are substantially constant while the voltage on the capacitor is changing.

20. The integrated circuit of claim 17 wherein the magnitude of the first current source and the magnitude of the second current source are proportional with a ratio that is substantially constant while the voltage on the capacitor is changing.

21. The integrated circuit of claim 17 wherein the magnitude of the first current source and the magnitude of the second current source are variable.

* * * * *